(12) United States Patent
Chen et al.

(10) Patent No.: US 12,727,224 B2
(45) **Date of Patent: *Sep. 1, 2026**

(54) METHOD OF MANUFACTURING STRUCTURE HAVING A METAL LAYER INCLUDING ELECTRODE AND ANODIZED SEGMENTS THROUGH THE USE OF PATTERNED PHOTORESIST

(71) Applicant: MIKRO MESA TECHNOLOGY CO., LTD., Apia (WS)

(72) Inventors: Li-Yi Chen, Tainan City (TW); Chieh-Ting Chen, Hsinchu City (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 425 days.

This patent is subject to a terminal disclaimer.

(21) Appl. No.: 18/530,239

(22) Filed: Dec. 6, 2023

(65) Prior Publication Data

US 2025/0191924 A1 Jun. 12, 2025

(51) Int. Cl.

*H10D 64/01* (2025.01)
*H10P 50/00* (2026.01)
*H10P 50/26* (2026.01)
*H10P 76/20* (2026.01)

(52) U.S. Cl.

CPC ..... *H10D 64/01354* (2026.01); *H10P 50/267* (2026.01); *H10P 50/71* (2026.01); *H10P 76/2041* (2026.01); *H10P 76/20* (2026.01)

(58) Field of Classification Search

CPC .......... H10D 64/01354; H10P 76/2041; H10P 50/71; H10P 50/267

See application file for complete search history.

(56) References Cited

U.S. PATENT DOCUMENTS

2002/0159010 A1* 10/2002 Maeda .............. G02F 1/133553 349/113
2004/0134878 A1* 7/2004 Matsushita ....... G02F 1/136227 257/E27.111
2008/0093744 A1* 4/2008 Wang .................. C25D 11/022 257/758
2015/0279976 A1* 10/2015 Shih ....................... H10D 99/00 257/43
2025/0191931 A1* 6/2025 Chen ....................... H10P 50/71

* cited by examiner

*Primary Examiner* — Davienne N Monbleau
*Assistant Examiner* — Dmitri Mihaliov
(74) *Attorney, Agent, or Firm* — CKC & Partners Co., LLC

(57) ABSTRACT

A method of manufacturing a structure having an electrode and an anodized part includes: forming a top metal layer on a substrate; forming a top patterned photoresist on the top metal layer to expose a portion of a top surface of the top metal layer, in which the top patterned photoresist has a first mask portion and a second mask portion thicker than the first mask portion; anodizing the top metal layer through the top patterned photoresist to form an anodized segment; removing the first mask portion after the anodizing; etching the top metal layer through the top patterned photoresist after the removing the first mask portion to form a top metal pattern; and reflowing the top patterned photoresist after the anodizing and before the etching.

22 Claims, 15 Drawing Sheets

BM' {LP1, LP2}

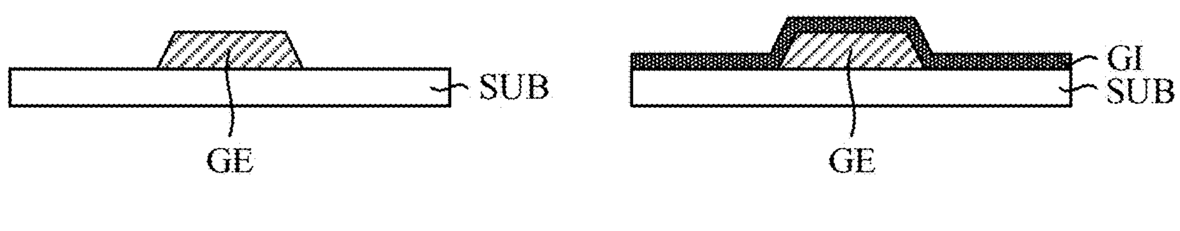
Fig. 8A
Fig. 8B
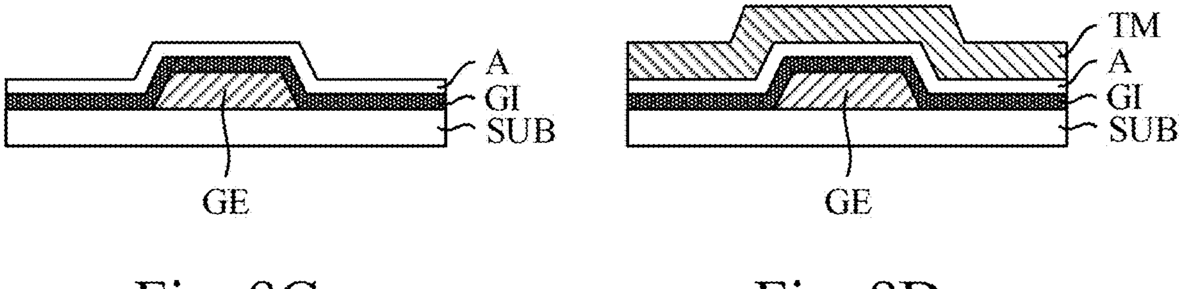
Fig. 8C
Fig. 8D
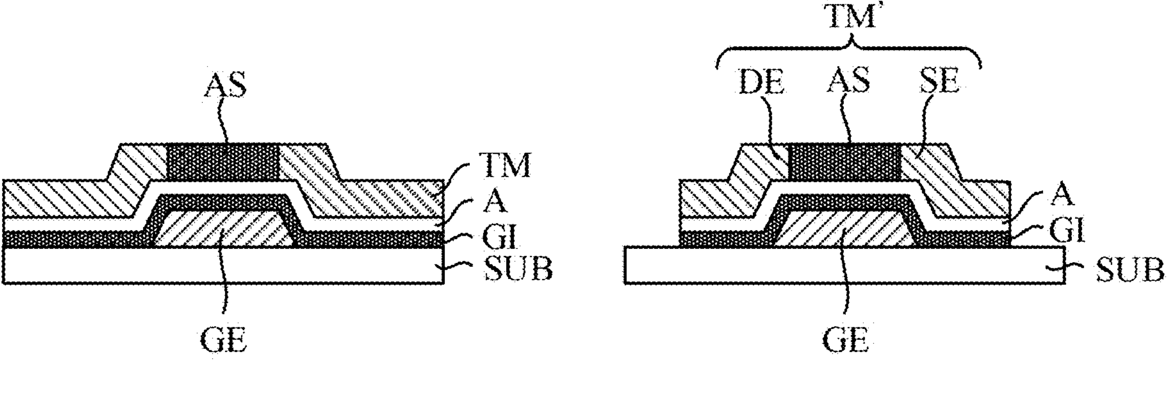
Fig. 8E
Fig. 8F

METHOD OF MANUFACTURING STRUCTURE HAVING A METAL LAYER INCLUDING ELECTRODE AND ANODIZED SEGMENTS THROUGH THE USE OF PATTERNED PHOTORESIST

BACKGROUND

Field of Invention

The present disclosure relates to a method of manufacturing a structure having an electrode and an anodized part.

Description of Related Art

The statements in this section merely provide background information related to the present disclosure and do not necessarily constitute prior art.

Traditional display manufacturing is a standardized process set. In recent years, there are more and more new types of displays such as a micro light-emitting diode display, a mini light-emitting diode display, and a quantum dot light-emitting diode display . . . etc., which are promising to dominate the future display market, and thus new display manufacturing processes are waiting to be set up. There are many steps contained in a manufacturing process set in order to produce one display, and reducing one of the steps thereof can reduce the cost and enhance the efficiency.

SUMMARY

According to some embodiments of the present disclosure, a method of manufacturing a structure having an electrode and an anodized part includes: forming a top metal layer on a substrate; forming a top patterned photoresist on the top metal layer to expose a portion of a top surface of the top metal layer, in which the top patterned photoresist has a first mask portion and a second mask portion thicker than the first mask portion; anodizing the top metal layer through the top patterned photoresist to form an anodized segment; removing the first mask portion after the anodizing; etching the top metal layer through the top patterned photoresist after the removing the first mask portion to form a top metal pattern; and reflowing the top patterned photoresist after the anodizing and before the etching.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIGS. 8A to 8F are schematic cross-sectional views of intermediate stages of a method of manufacturing a structure having an electrode and an anodized part according to some embodiments of the present disclosure;

DETAILED DESCRIPTION

Figure 1:
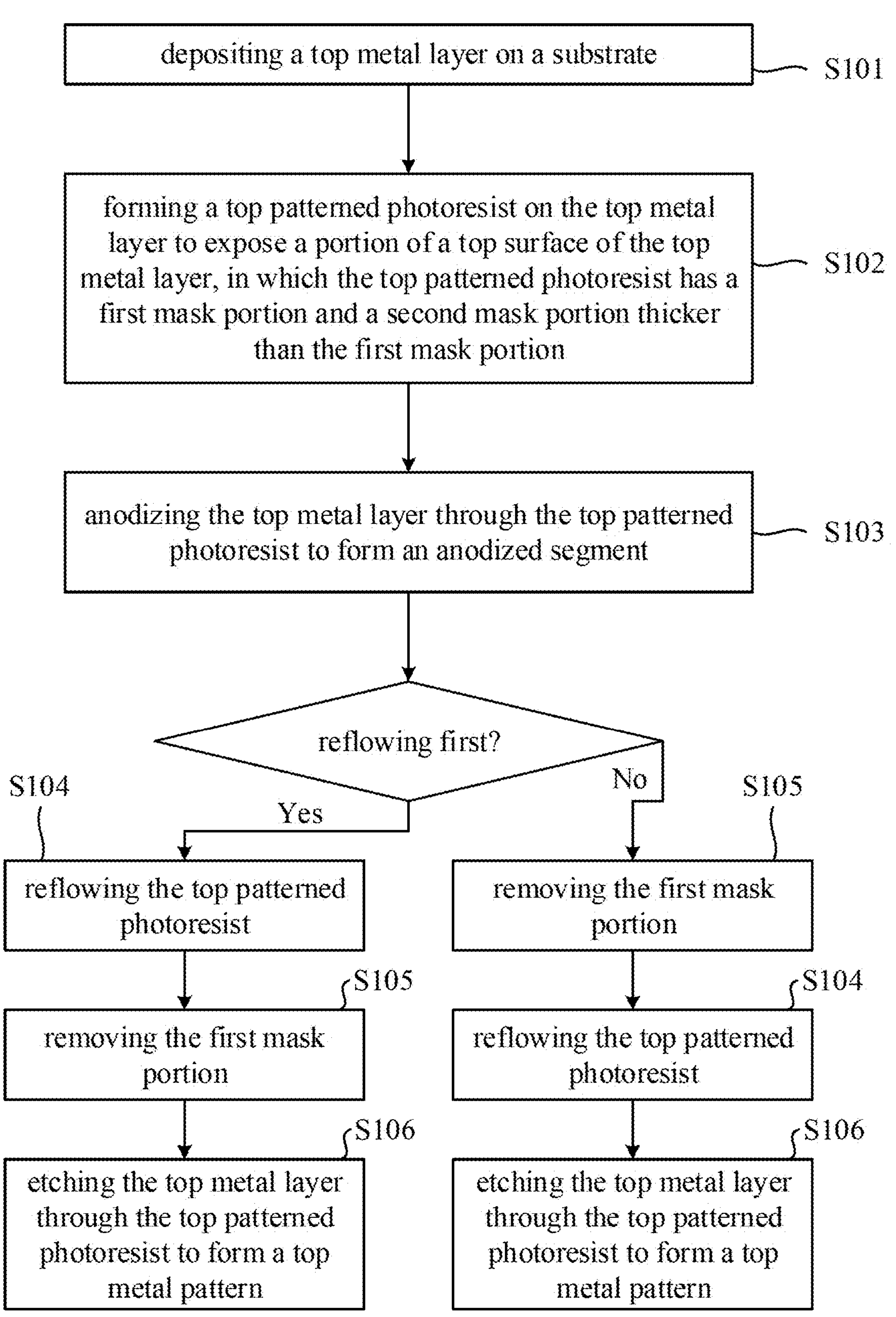
FIG. 1 is a flowchart of a method of manufacturing a structure having an electrode and an anodized part according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments.

Reference is made to FIG. 1. FIG. 1 is a flowchart of a method of manufacturing a structure having an electrode and an anodized part according to some embodiments of the present disclosure. The method begins with step S101 in which a top metal layer is formed on a substrate. The method continues with step S102 in which a top patterned photoresist is formed on the top metal layer to expose a portion of a top surface of the top metal layer, in which the top patterned photoresist has a first mask portion and a second mask portion thicker than the first mask portion. The method continues with step S103 in which the top metal layer is anodized through the top patterned photoresist to form an anodized segment. In some embodiments where a reflowing step is performed first, the method continues with step S104 in which the top patterned photoresist is reflowed. The method continues with step S105 in which the first mask portion is removed. The method continues with step S106 in which the top metal layer is etched through the top patterned photoresist to form a top metal pattern. In some embodiments where the reflowing step is not performed first, step S104 can be performed after step S105 and before step S106. While the method is illustrated and described below as a series of steps or events, it will be appreciated that the illustrated ordering of such steps or events are not to be interpreted in a limiting sense. For example, some steps may occur in different orders and/or concurrently with other steps or events apart from those illustrated and/or described herein. In addition, not all illustrated steps may be required to implement one or more aspects or embodiments of the description herein. Further, one or more of the steps depicted herein may be carried out in one or more separate steps and/or phases.

Figure 2A:
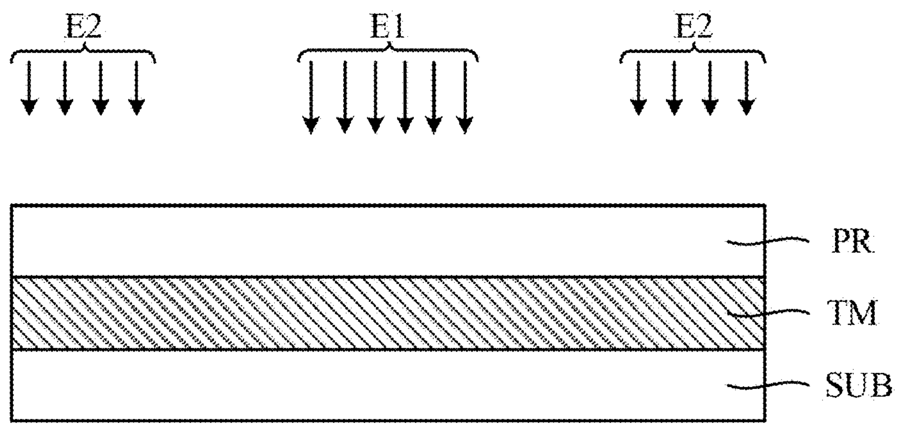
FIGS. 2A to 2F and 2H are schematic cross-sectional views of intermediate stages of a method of manufacturing a structure having an electrode and an anodized part according to some embodiments of the present disclosure.

Reference is made to FIG. 2A. FIG. 2A is a schematic cross-sectional view of an intermediate stage of a method of manufacturing a structure having an electrode and an anodized part according to some embodiments of the present disclosure. As shown in FIG. 2A, a top metal layer TM is formed on a substrate SUB, for example, by depositing, and a patterned photoresist PR is formed on the top metal layer TM. A material of the photoresist PR is a positive tone photoresist layer. A first region of the photoresist PR is exposed with a first exposure dose E1 of light. Second regions of the photoresist PR are exposed with a second exposure dose E2 of light which is smaller than the first exposure dose E1. Third regions of the photoresist PR are not exposed. In some embodiments, the photoresist PR may be exposed by UV light, but the present disclosure is not limited in this regard. In some embodiments, the photoresist PR may be exposed by using a gray-tone mask (or a half-tone mask). For example, the half-tone mask may include full exposed portions where the full intensity of light (i.e., the first exposure dose E1) would be transmitted, half tone portions where parts of the light (e.g., the second exposure dose E2, which may be 20% to 60% of the first exposure dose E1) would be transmitted, and full tone portions where the light would be perfectly blocked.

In some embodiments, the top metal layer TM contains metal that can be anodized. In some embodiments, the bottom metal layer BM may include at least one element of aluminum, zirconium, hafnium, and tantalum. In some other embodiments, the bottom metal layer BM may include at least one rare earth element. In some embodiments, an atomic ratio of aluminum in the top metal layer TM is greater than 80%, so as to have better conductivity, but the disclosure is not limited in this regard.

Figure 2B:
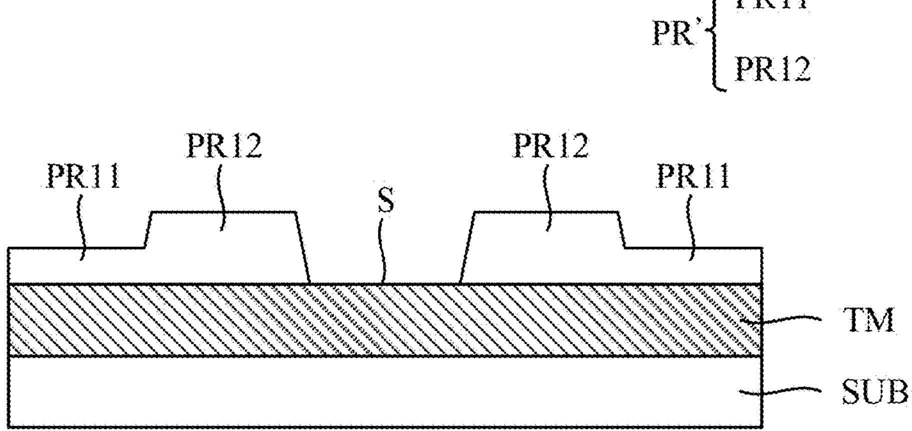

Reference is made to FIG. 2B. FIG. 2B is a schematic cross-sectional view of an intermediate stage of a method of manufacturing a structure having an electrode and an anodized part according to some embodiments of the present disclosure. The intermediate stage shown in FIG. 2A may be sequentially followed by the intermediate stage shown in FIG. 2B. As shown in FIG. 2B, the exposed photoresist PR is then developed to form a patterned photoresist PR'. The patterned photoresist PR' includes a first mask portion PR11 and a second mask portion PR12. The second mask portion PR12 is thicker than the first mask portion PR11. The patterned photoresist PR' has a hollow portion which expose a part S of a top surface of the top metal layer TM. It can be seen that the region of the photoresist PR exposed with the first exposure dose E1 will be entirely removed, the regions of the photoresist PR exposed with the second exposure dose E2 will be partially removed to form the first mask portion PR11, and the regions of the photoresist PR not exposed will be originally remained to form the second mask portion PR12.

Figure 2C:
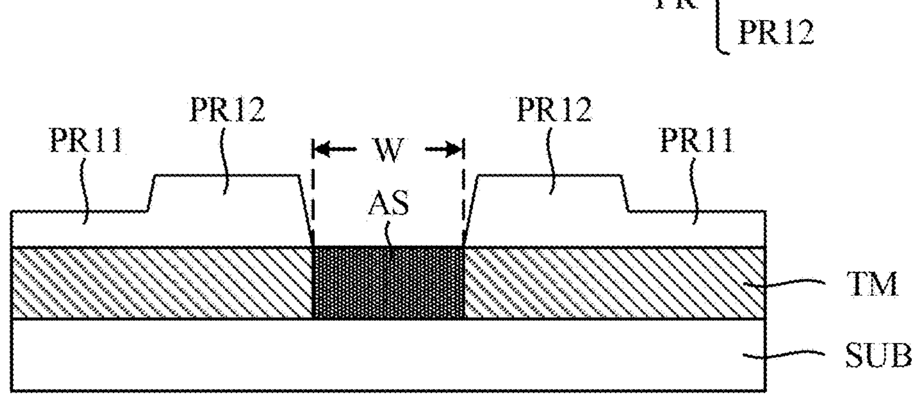

Reference is made to FIG. 2C. FIG. 2C is a schematic cross-sectional view of an intermediate stage of a method of manufacturing a structure having an electrode and an anodized part according to some embodiments of the present disclosure. The intermediate stage shown in FIG. 2B may be sequentially followed by the intermediate stage shown in FIG. 2C. As shown in FIG. 2C, the top metal layer TM is anodized through the patterned photoresist PR' to form an anodized segment AS (i.e., anodic oxide). As mentioned above, the top metal layer TM contains metal that can be anodized (e.g., aluminum), so that the top metal layer TM can be anodized to extend the anodized segment AS to reach a side of the top metal layer TM away from the patterned photoresist PR'.

Figure 2D:
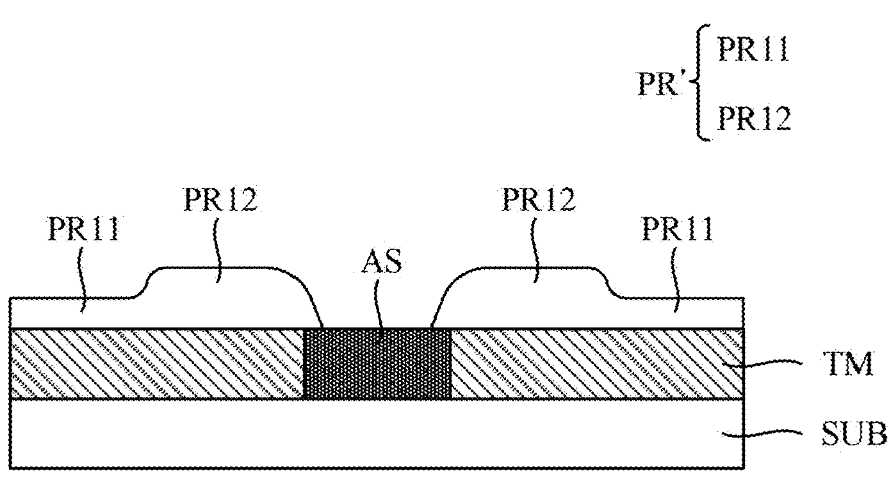

Reference is made to FIG. 2D. FIG. 2D is a schematic cross-sectional view of an intermediate stage of a method of manufacturing a structure having an electrode and an anodized part according to some embodiments of the present disclosure. The intermediate stage shown in FIG. 2C may be sequentially followed by the intermediate stage shown in FIG. 2D. As shown in FIG. 2D, the patterned photoresist PR' is reflowed, such that the coverage area of the patterned photoresist PR' on the top surface of the anodized segment AS becomes larger. In order to reflow the patterned photoresist PR', the patterned photoresist PR' is baked above the glass transition temperature (Tg) thereof. In some embodiments, the patterned photoresist PR' still exposes the top surface of the anodized segment AS after reflowing. That is, the patterned photoresist PR' does not entirely cover the top surface of the anodized segment AS after reflowing. In some embodiments where the lateral size of the anodized segment AS is less than 1 μm, there is a chance that patterned photoresist PR' will entirely cover the anodized segment AS after being reflowed. However, since the anodizing is done first, the entire coverage of the patterned photoresist PR' onto the anodized segment AS does not significantly affect the electrical properties of the anodized segment AS.

Figure 2E:
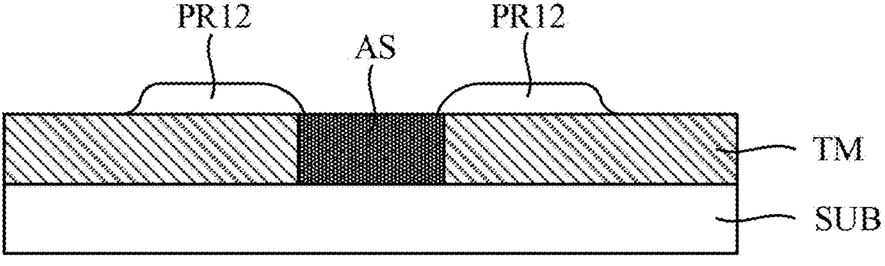

Reference is made to FIG. 2E. FIG. 2E is a schematic cross-sectional view of an intermediate stage of a method of manufacturing a structure having an electrode and an anodized part according to some embodiments of the present disclosure. The intermediate stage shown in FIG. 2D may be sequentially followed by the intermediate stage shown in FIG. 2E. As shown in FIG. 2E, the first mask portion PR11 is removed after the anodization of the top metal layer TM is finished. In some embodiments, an ashing process is performed to the first mask portion PR11 and the second mask portion PR12 until the first mask portion PR11 is entirely removed and the remaining second mask portion PR12 still covers the top surface of the top metal layer TM. Specifically, the first mask portion PR11 is removed to expose other parts of the top surface of the top metal layer TM, and the peripheral edge of the top surface of the anodized segment AS is not exposed by the remaining second mask portion PR12. In some embodiments, oxygen plasma is used in the ashing process to perform the erosion of the first mask portion PR11 and the second mask portion PR12. It can be seen that the reflowing of the patterned photoresist PR' can compensate for the reduction of the coverage area of the patterned photoresist PR' on the top surface of the anodized segment AS.

Figure 2F:
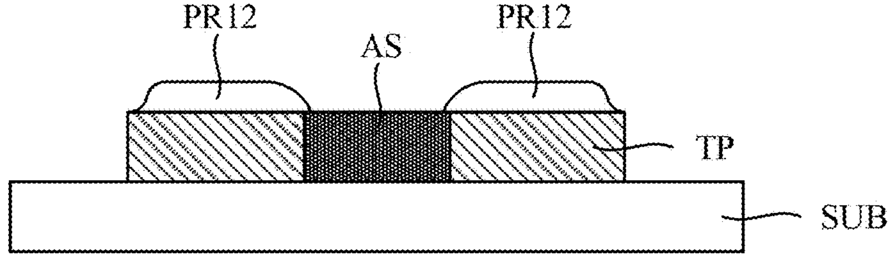
Figure 2G:
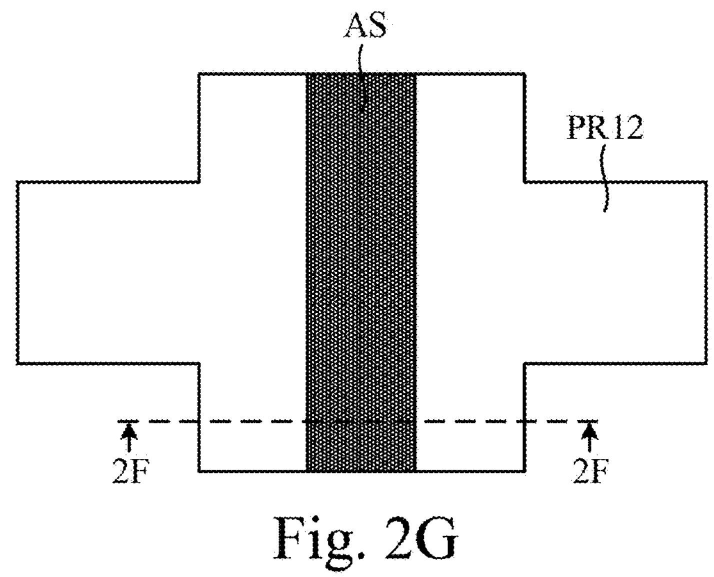
FIG. 2G is a schematic top view of the structure shown in FIG. 2F, in which the cross-section shown in FIG. 2F is taken along line 2F-2F in FIG. 2G.

Reference is made to FIGS. 2F and 2G. FIG. 2F is a schematic cross-sectional view of an intermediate stage of a method of manufacturing a structure having an electrode and an anodized part according to some embodiments of the present disclosure. FIG. 2G is a schematic top view of the structure shown in FIG. 2F, in which the cross-section shown in FIG. 2F is taken along line 2F-2F in FIG. 2G. The intermediate stage shown in FIG. 2E may be sequentially followed by the intermediate stage shown in FIGS. 2F and 2G. As shown in FIGS. 2F and 2G, the top metal layer TM is etched through the remaining second mask portion PR12 to form a top metal pattern TP which may serve as an electrode.

In some embodiments, an etch selectivity of the top metal layer TM and the anodized segment AS in the step of etching the top metal layer TM (as shown in FIGS. 2F and 2G) is higher than 2.0. In this way, the anodized segment AS can resist the step of etching the top metal layer TM.

Figure 2H:
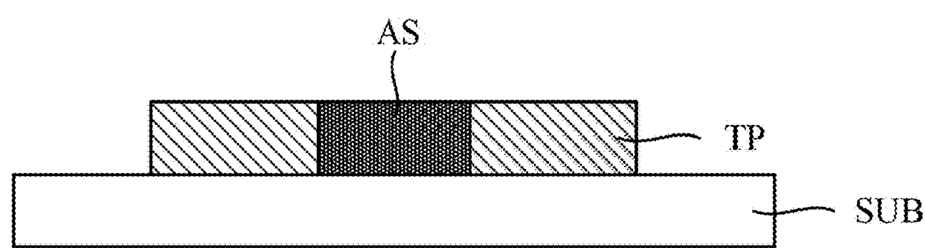

Reference is made to FIG. 2H. FIG. 2G is a schematic cross-sectional view of an intermediate stage of a method of manufacturing a structure having an electrode and an anodized part according to some embodiments of the present disclosure. The intermediate stage shown in FIGS. 2F and 2G may be sequentially followed by the intermediate stage shown in FIG. 2H. As shown in FIG. 2H, the remaining second mask portion PR12 is removed to expose the top surface of the top metal pattern TP.

Figure 3A:
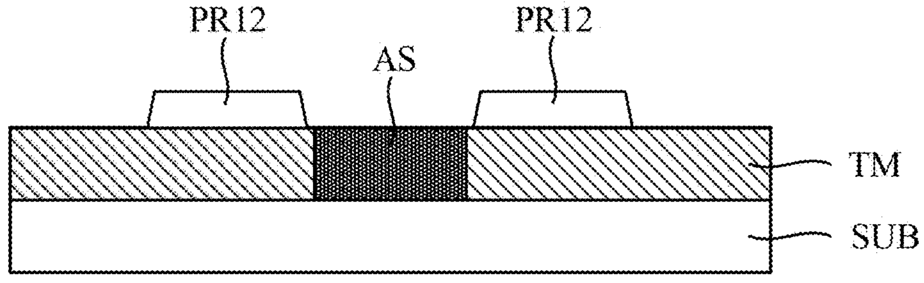
FIGS. 3A to 3D are schematic cross-sectional views of intermediate stages of a method of manufacturing a structure having an electrode and an anodized part according to some embodiments of the present disclosure.
Figure 3B:
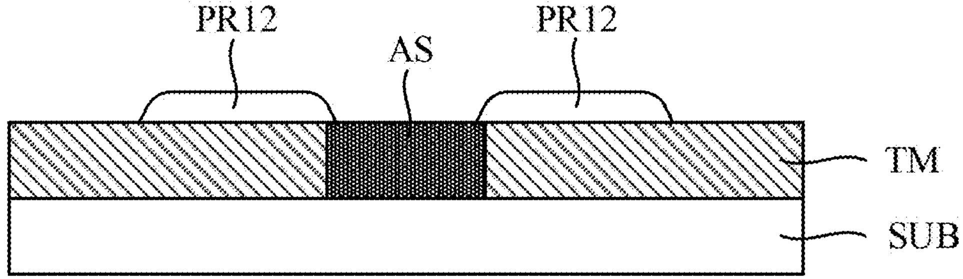

Reference is made to FIG. 3A. FIG. 3A is a schematic cross-sectional view of an intermediate stage of a method of manufacturing a structure having an electrode and an anodized part according to some embodiments of the present disclosure. The intermediate stage shown in FIG. 2C may be sequentially followed by the intermediate stage shown in FIG. 3A. As shown in FIG. 3A, the first mask portion PR11 is removed after the anodization of the top metal layer TM is finished. In some embodiments, an ashing process is performed to the first mask portion PR11 and the second mask portion PR12 until the first mask portion PR11 is entirely removed and the remaining second mask portion PR12 still covers the top surface of the top metal layer TM. Specifically, the first mask portion PR11 is removed to expose other parts of the top surface of the top metal layer TM, and the top surface of the anodized segment AS is entirely exposed by the remaining second mask portion PR12. In some embodiments, oxygen plasma is used in the ashing process to perform the erosion of the first mask portion PR11 and the second mask portion PR12. Reference is made to FIG. 3B. FIG. 3B is a schematic cross-sectional view of an intermediate stage of a method of manufacturing a structure having an electrode and an anodized part according to some embodiments of the present disclosure. The intermediate stage shown in FIG. 3A may be sequentially followed by the intermediate stage shown in FIG. 3B. As shown in FIG. 3B, the remaining second mask portion PR12 is reflowed, such that the remaining second mask portion PR12 partially covers the top surface of the anodized segment AS. In order to reflow the remaining second mask portion PR12, the remaining second mask portion PR12 is baked above the glass transition temperature (Tg) thereof. That is, the remaining second mask portion PR12 does not entirely cover the top surface of the anodized segment AS after reflowing. In detail, the peripheral edge of the top surface of the anodized segment AS is not exposed by the remaining second mask portion PR12 after reflowing.

Figure 3C:
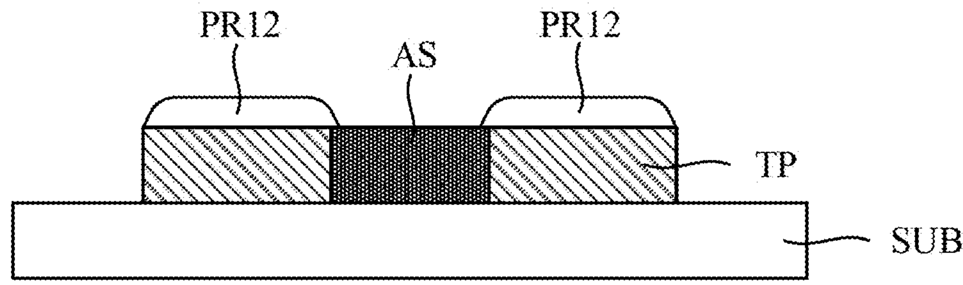

Reference is made to FIG. 3C. FIG. 3C is a schematic cross-sectional view of an intermediate stage of a method of manufacturing a structure having an electrode and an anodized part according to some embodiments of the present disclosure. The intermediate stage shown in FIG. 3B may be sequentially followed by the intermediate stage shown in FIG. 3C. As shown in FIG. 3C, the top metal layer TM is etched through the remaining second mask portion PR12 to form a top metal pattern TP which may serve as an electrode.

In some embodiments, an etch selectivity of the top metal layer TM and the anodized segment AS in the step of etching the top metal layer TM (as shown in FIG. 3C) is higher than 2.0. In this way, the anodized segment AS can resist the step of etching the top metal layer TM.

Figure 3D:
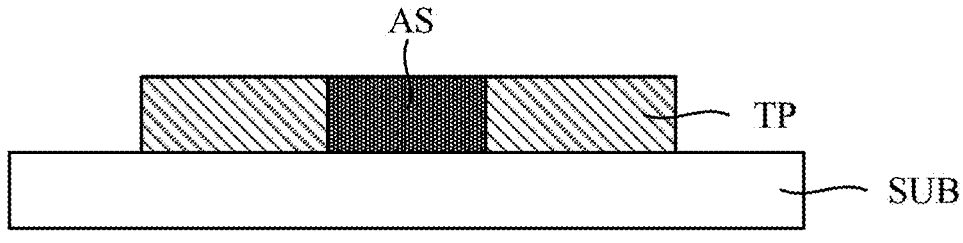

Reference is made to FIG. 3D. FIG. 3D is a schematic cross-sectional view of an intermediate stage of a method of manufacturing a structure having an electrode and an anodized part according to some embodiments of the present disclosure. The intermediate stage shown in FIG. 3C may be sequentially followed by the intermediate stage shown in FIG. 3D. As shown in FIG. 3D, the remaining second mask portion PR12 is removed to expose the top surface of the top metal pattern TP.

Figure 4A:
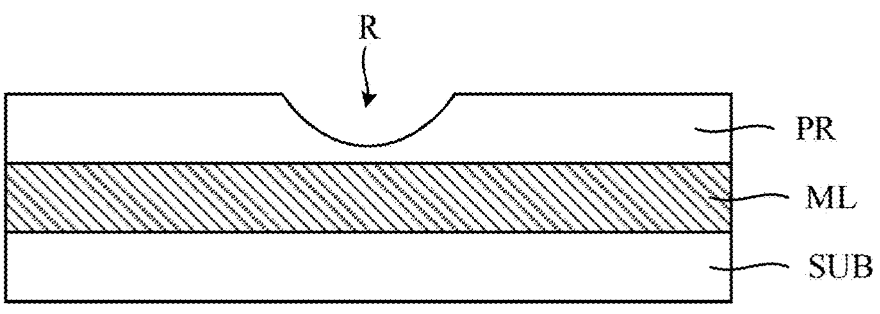
FIGS. 4A to 4C are schematic cross-sectional views of a process of forming an opening in a photoresist to expose a metal layer under the photoresist according to some embodiments of the present disclosure.
Figure 4B:
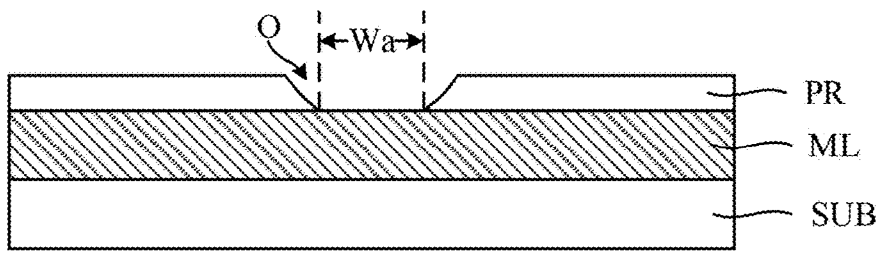
Figure 4C:
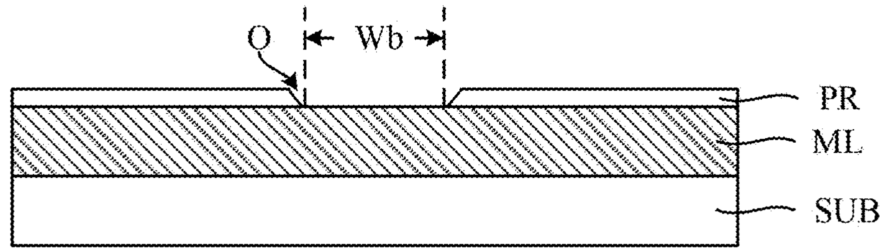

Reference is made to FIGS. 4A to 4C. FIGS. 4A to 4C are schematic cross-sectional views of a process of forming an opening O in a photoresist PR to expose a metal layer ML under the photoresist PR according to some embodiments of the present disclosure. As shown in FIG. 4A, the photoresist PR is exposed by using a gray-tone mask (or a half-tone mask) and then developed to form a recess R on its top surface. As shown in FIG. 4B, an ashing process is performed to the photoresist PR having the recess R, so as to form the opening O with a width Wa. As shown in FIG. 4C, the ashing process is continuously performed to the photoresist PR to expand the opening O from the width Wa to a width Wb.

Accordingly, by comparing FIGS. 2A-2C with FIGS. 4A-4C, it can be seen that a space between two patterns of a patterned photoresist PR' can be better controlled by development rather than the ashing process, especially when the dimension of the space opened (e.g., the width W shown in FIG. 2C) is smaller than 20 μm.

In some embodiments, the method of manufacturing a structure having an electrode and an anodized part of the present disclosure may be used to manufacture a thin-film transistor, which can be exemplified by FIG. 5A to FIG. 5K.

Figure 4D:
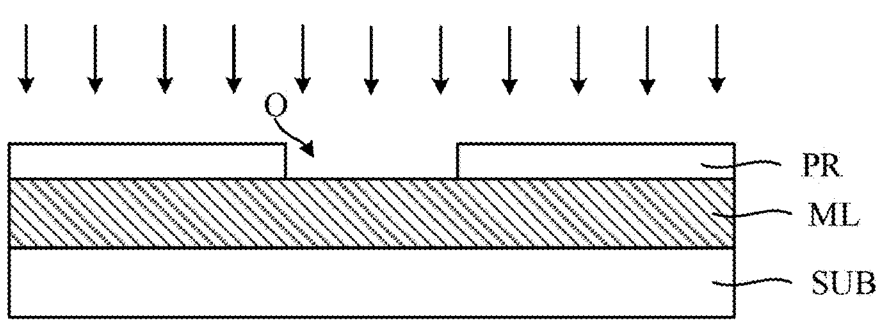
FIG. 4D is a schematic cross-sectional view of a process of forming an opening in a photoresist to expose a metal layer under the photoresist according to some embodiments of the present disclosure.

Reference is made to FIG. 4D. FIG. 4D is a schematic cross-sectional view of a process of forming an opening O in a photoresist PR to expose a metal layer ML under the photoresist PR according to some embodiments of the present disclosure. The intermediate stage shown in FIG. 4A may be sequentially followed by the intermediate stage shown in FIG. 4D. As shown in FIG. 4D, a plasma ashing process is performed to the photoresist PR having the recess R, so as to form the opening O. Specifically, gas used in the plasma ashing process contains $CO_2$. It should be pointed out that $CO_2$ ions are directional due to acceleration with a plasma sheath. In this way, compared with the opening O in FIG. 4B, the inner walls of the opening O in FIG. 4D are relatively steep, and the width of the opening O can be better controlled.

Figure 5A:
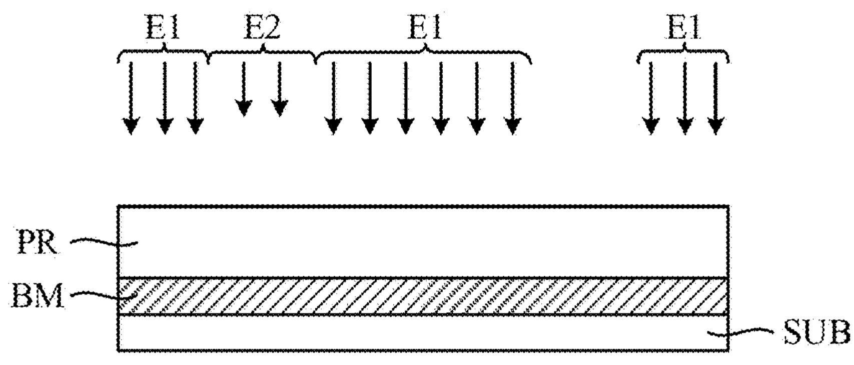
FIGS. 5A to 5K are schematic cross-sectional views of intermediate stages of a method of manufacturing a structure having an electrode and an anodized part according to some embodiments of the present disclosure.

Reference is made to FIG. 5A. FIG. 5A is a schematic cross-sectional view of an intermediate stage of a method of manufacturing a structure having an electrode and an anodized part according to some embodiments of the present disclosure. As shown in FIG. 5A, a bottom metal layer BM is formed on a substrate SUB, and a photoresist PR is formed on the bottom metal layer BM. An atomic ratio of aluminum in the bottom metal layer BM is greater than 60%. A material of the photoresist PR is a positive tone photoresist layer. First regions of the photoresist PR are exposed with a first exposure dose E1 of light. Second regions of the photoresist PR are exposed with a second exposure dose E2 of light which is smaller than the first exposure dose E1. Third regions of the photoresist PR are not exposed. In some embodiments, the photoresist PR may be exposed by UV light, but the present disclosure is not limited in this regard. In some embodiments, the photoresist PR may be exposed by using a gray-tone mask (or a half-tone mask). For example, the half-tone mask may include full exposed portions where the full intensity of light (i.e., the first exposure dose E1) would be transmitted, half tone portions where parts of the light (e.g., the second exposure dose E2, which may be 20% to 60% of the first exposure dose E1) would be transmitted, and full tone portions where the light would be perfectly blocked.

Figure 5B:
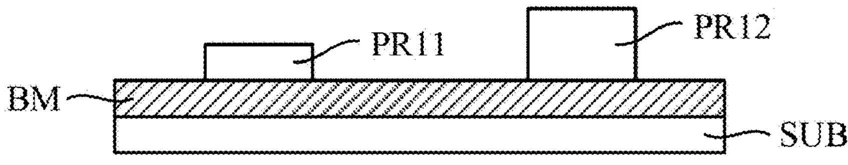

Reference is made to FIG. 5B. FIG. 5B is a schematic cross-sectional view of an intermediate stage of a method of manufacturing a structure having an electrode and an anodized part according to some embodiments of the present disclosure. The intermediate stage shown in FIG. 5A may be sequentially followed by the intermediate stage shown in FIG. 5B. As shown in FIG. 5B, the exposed photoresist PR is then developed to form a first patterned photoresist PR1. The first patterned photoresist PR1 has a first mask portion PR11 and a second mask portion PR12. The second mask portion PR12 is thicker than the first mask portion PR11. It can be seen that the regions of the photoresist PR exposed with the first exposure dose E1 will be entirely removed, the regions of the photoresist PR exposed with the second exposure dose E2 will be partially removed to form the first mask portion PR11, and the regions of the photoresist PR not exposed will be originally remained to form the second mask portion PR12.

Figure 5C:
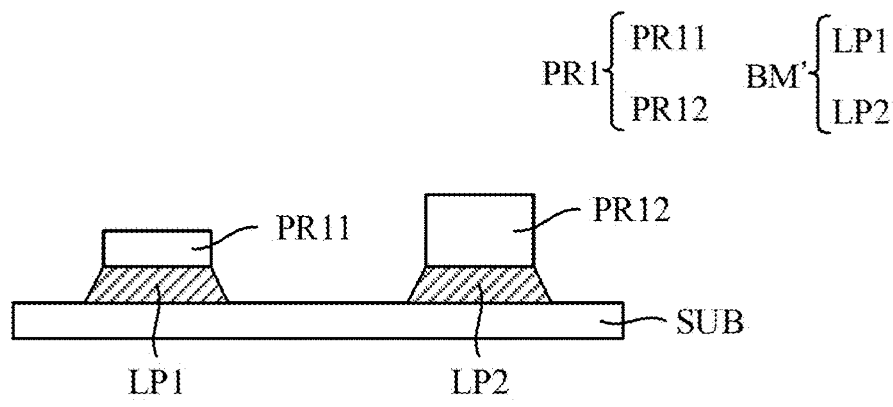

Reference is made to FIG. 5C. FIG. 5C is a schematic cross-sectional view of an intermediate stage of a method of manufacturing a structure having an electrode and an anodized part according to some embodiments of the present disclosure. The intermediate stage shown in FIG. 5B may be sequentially followed by the intermediate stage shown in FIG. 5C. As shown in FIG. 50, the bottom metal layer BM is etched through the first patterned photoresist PR1 to form a first lower metal pattern LP1 and a second lower metal pattern LP2 that are respectively covered by the first mask portion PR11 and the second mask portion PR12.

In some embodiments, a wet etching process may be performed to etch the bottom metal layer BM. In some embodiments, a PAN etchant (a mixture of phosphoric acid, acetic acid, nitric acid, and water) may be used in the wet etching process. For example, a mixing ratio of phosphoric acid, acetic acid, nitric acid, and water may be 16:1:1:2, but the present disclosure is not limited in this regard. In some other embodiments, hydrogen peroxide and sulfuric acid may be used in the wet etching process.

In some embodiments, a dry etching process may be performed to etch the bottom metal layer BM. For example, the dry etching process may be an ECCP (Enhanced Capacitance Coupled Plasma) process using, for example, $Cl_2$ and $BCl_3$, but the present disclosure is not limited in this regard.

Figure 5D:
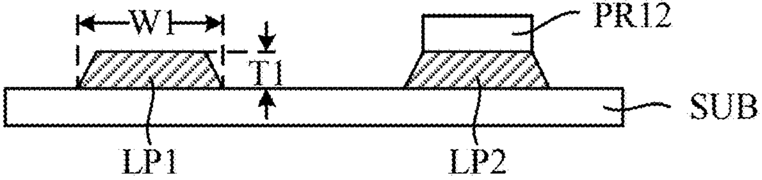

Reference is made to FIG. 5D. FIG. 5D is a schematic cross-sectional view of an intermediate stage of a method of manufacturing a structure having an electrode and an anodized part according to some embodiments of the present disclosure. The intermediate stage shown in FIG. 5C may be sequentially followed by the intermediate stage shown in FIG. 5D. As shown in FIG. 5D, the first mask portion PR11 is removed to expose the top surfaces of the first lower metal pattern LP1. In some embodiments, an ashing process is performed to the first mask portion PR11 and the second mask portion PR12 until the first mask portion PR11 is entirely removed and the second mask portion PR12 still covers the top surface of the second lower metal pattern LP2. In some embodiments, oxygen plasma is used in the ashing process to perform the erosion of the first mask portion PR11 and the second mask portion PR12.

Figure 5E:
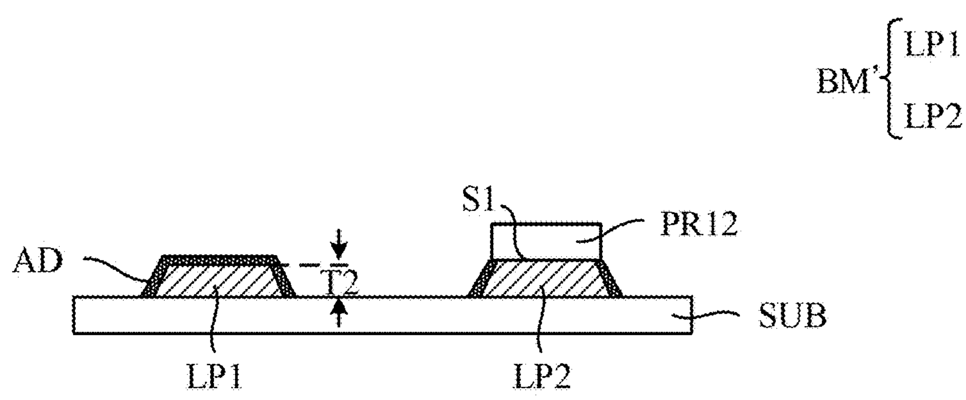

Reference is made to FIG. 5E. FIG. 5E is a schematic cross-sectional view of an intermediate stage of a method of manufacturing a structure having an electrode and an anodized part according to some embodiments of the present disclosure. The intermediate stage shown in FIG. 5D may be sequentially followed by the intermediate stage shown in FIG. 5E. As shown in FIG. 5E, the etched bottom metal layer BM' is anodized. The first lower metal pattern LP1 and the second lower metal pattern LP2 are partially anodized after the anodizing and thus have anodized parts AD (i.e., anodic oxide). The anodized second lower metal pattern LP2 has a surface portion S1 that is unanodized and in contact with the second mask portion PR12.

In some embodiments, the etched bottom metal layer BM' is anodized to reach a termination voltage. Each of the first lower metal pattern LP1 and the second lower metal pattern LP2 has a thickness T1 (e.g., a vertical length of the first lower metal pattern LP1 in FIG. 5D) and a width W1 (e.g., a lateral length of the first lower metal pattern LP1 in FIG. 5D) before being anodized, and the termination voltage is less than a smallest one of the thickness T1 and the width W1 in nm divided by 0.9 $nm\text{-}V^{-1}$. In this way, the etched bottom metal layer BM' will not be fully anodized and leave conductive parts.

In some embodiments, the width W1 of the first lower metal pattern LP1 is greater than the thickness T1 of the first lower metal pattern LP1, but the disclosure is not limited in this regard.

In some embodiments, the termination voltage that the etched bottom metal layer BM' is anodized to reach is greater than 10 Volt and smaller than 500 Volt. It should be pointed out that if the etched bottom metal layer BM' is anodized to reach a termination voltage greater than 500 Volt, the thickness of the anodized parts AD of the etched bottom metal layer BM' (e.g., the anodized part AD of the first lower metal pattern LP1) may be too thick and result in high operation voltage of thin-film transistors.

In some embodiments, the etched bottom metal layer BM' is anodized by applying a constant current greater than 0.5 $mA/cm^2$. In some embodiments, the constant current is between 0.05 $mA/cm^2$ and 5 $mA/cm^2$.

In some embodiments, the etched bottom metal layer BM' is anodized until the termination voltage is reached and kept for at least 300 seconds. It makes more uniform thickness of the anodized parts AD of the etched bottom metal layer BM'.

In some embodiments, an annealing process may be performed to the anodized bottom metal layer BM'. In this way, the resistance of the anodized bottom metal layer BM' (e.g., the anodized part AD of the anodized first lower metal pattern LP1) to a second wet etching process (if any) can be increased. In some embodiments, an annealing temperature used in the annealing process is greater than 200° C., but the disclosure is not limited in this regard.

In some embodiments, the etched bottom metal layer BM' is anodized by using an electrolyte with a pH value between pH5 and pH8. It should be pointed out that if the pH value is smaller than pH5 or greater than pH8, there will be more pores in the anodized parts AD of the etched bottom metal layer BM'.

In some embodiments, the etched bottom metal layer BM' is anodized by using an electrolyte containing a content of water less than 45 wt %. In this way, the Hydrogen content in the anodized parts AD of the etched bottom metal layer BM' can be small. The Hydrogen content may reduce the breakdown voltage of the gate insulator. Hydrogen sometimes affects the semiconductor layer A and reduces its stability.

In some embodiments, the etched bottom metal layer BM' is anodized by using an electrolyte containing water, ethylene glycol, and ammonium tartrate. For example, the electrolyte may contain ethylene glycol of about 68.5 wt %, water of about 30 wt %, and ammonium tartrate of about 1.5 wt %, but the disclosure is not limited in this regard.

In some embodiments, the etched bottom metal layer BM' is anodized at a temperature under 15° C. In this way, the anodized parts AD of the etched bottom metal layer BM' will be denser and thus the quality can be improved.

Figure 5F:
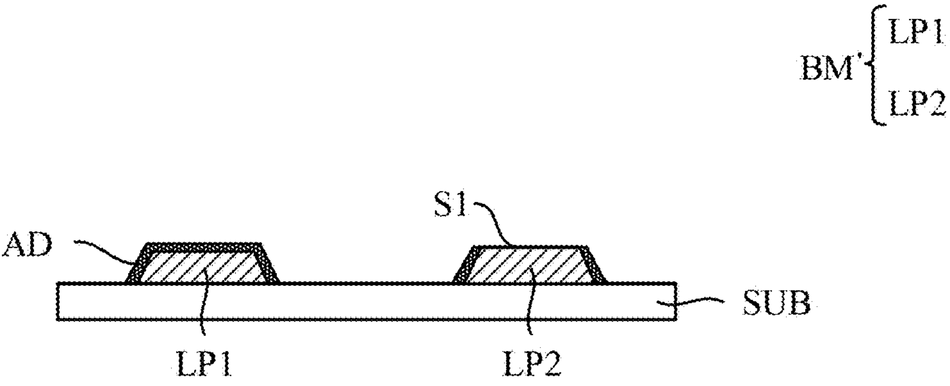

Reference is made to FIG. 5F. FIG. 5F is a schematic cross-sectional view of an intermediate stage of a method of manufacturing a structure having an electrode and an anodized part according to some embodiments of the present disclosure. The intermediate stage shown in FIG. 5E may be sequentially followed by the intermediate stage shown in FIG. 5F. As shown in FIG. 5F, the second mask portion PR12 is removed to expose the surface portion S1 of the second lower metal pattern LP2 that is unanodized.

Figure 5G:
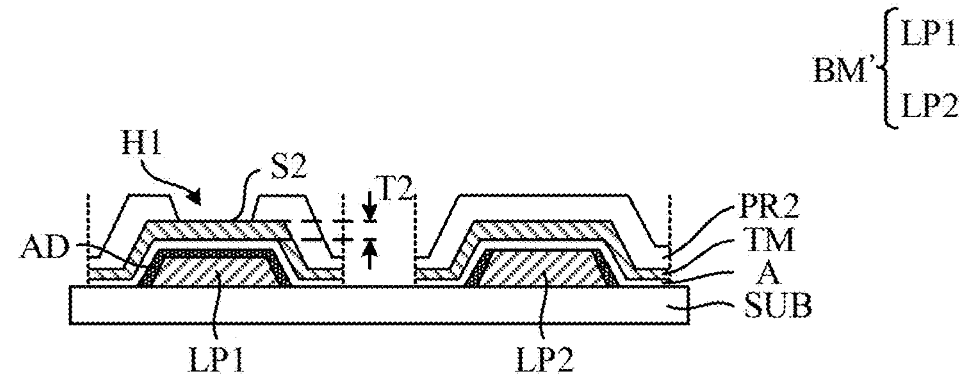

Reference is made to FIG. 5G. FIG. 5G is a schematic cross-sectional view of an intermediate stage of a method of manufacturing a structure having an electrode and an anodized part according to some embodiments of the present disclosure. To further manufacture a thin-film transistor, the intermediate stage shown in FIG. 5F may be sequentially followed by the intermediate stage shown in FIG. 5G. As shown in FIG. 5G, a semiconductor layer A is deposited on the anodized bottom metal layer BM' to cover the first lower metal pattern LP1 and the second lower metal pattern LP2, such that the first lower metal pattern LP1 and the second lower metal pattern LP2 are in contact with the semiconductor layer A. The first lower metal pattern LP1 serves as a gate electrode, and the anodized part AD of the anodized first lower metal pattern LP1 serves as a gate insulator.

In some embodiments, the semiconductor layer A is an oxide semiconductor layer. In addition, the semiconductor layer A includes at least one element of aluminum, gallium, indium, zinc, tin, and zirconium, but the disclosure is not limited in this regard. In some other embodiments, the semiconductor layer A includes $MoS_2$.

In some embodiments, the semiconductor layer A may be deposited by a PVD (Physical Vapor Deposition) process or a CVD (Chemical Vapor Deposition) process.

In some embodiments, the semiconductor layer A may be a multi-layer structure containing different compositions. For example, the semiconductor layer A may be a double-layer structure including IZO (indium gallium zinc oxide) and IGZTO (indium gallium zinc tin oxide), but the disclosure is not limited in this regard. In this way, the channel mobility can be improved.

As shown in FIG. 5G, a top metal layer TM is deposited on the semiconductor layer A. It should be pointed out that a surface of the top metal layer TM in contact with the semiconductor layer A contains metal that can be anodized (e.g., aluminum). The combination of the semiconductor layer A and the top metal layer TM serves as a conductive layer. A second patterned photoresist PR2 is formed on the top metal layer TM. The formation method of the second patterned photoresist PR2 may be the same as or similar to that of the first patterned photoresist PR1, so the formation of the second patterned photoresist PR2 can be referred to the description about FIGS. 5A and 5B and will not be repeated here. The second patterned photoresist PR2 has a first hollow portion H1 exposing a surface portion S2 of the top metal layer TM.

In some embodiments, the step of depositing the semiconductor layer A and the step of depositing the top metal layer TM are performed continuously in vacuum That is, the semiconductor layer A does not come into contact with the atmosphere before the top metal layer TM is deposited. In some other embodiments, the step of depositing the semiconductor layer A and the step of depositing the top metal layer TM are performed in chambers with transferring in vacuum. In this way, the oxide semiconductor layer A can be prevented from contacting with air.

Figure 5H:
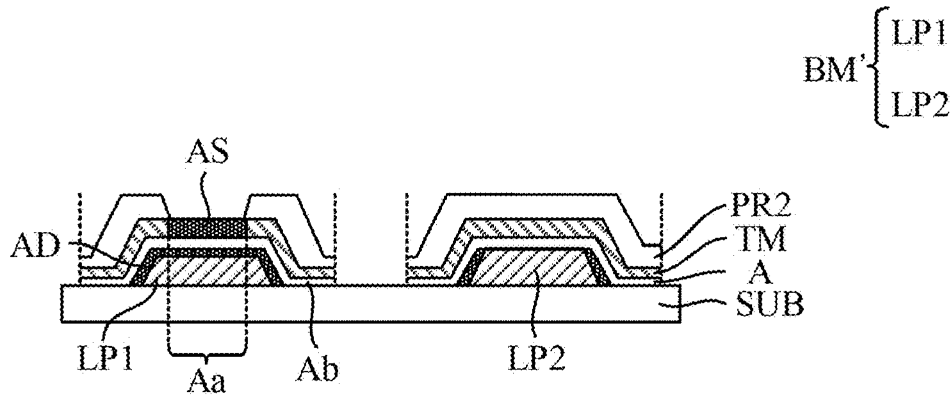

Reference is made to FIG. 5H. FIG. 5H is a schematic cross-sectional view of an intermediate stage of a method of manufacturing a structure having an electrode and an anodized part according to some embodiments of the present disclosure. The intermediate stage shown in FIG. 5G may be sequentially followed by the intermediate stage shown in FIG. 5H. As shown in FIG. 5H with reference to FIG. 5G, the surface portion S2 of the top metal layer TM is anodized through the second patterned photoresist PR2 until the top metal layer TM has an anodized segment AS (i.e., anodic oxide) extended from the surface portion S2 of the top metal layer TM to a side of the top metal layer TM facing the semiconductor layer A. As mentioned above, the surface of the top metal layer TM in contact with the semiconductor layer A contains metal that can be anodized (e.g., aluminum), so that the top metal layer TM can be anodized to extend the anodized segment AS to reach the side of the top metal layer TM facing the semiconductor layer A. In some embodiments, while the top metal layer TM is being anodized by applying a voltage V1 thereto, a voltage V2 is also applied to the first lower metal pattern LP1 at the same time, and the voltage V2 is greater than the voltage V1 minus 10 Volt. In this way, the semiconductor layer A may provide more carriers, and thus makes an alternative conducting path to assist the anodizing of the bottom of the anodized segment AS.

In some embodiments, the surface portion S2 of the top metal layer TM is anodized to reach a termination voltage. The top metal layer TM has a thickness T2 before being anodized, as shown in FIG. 5G. The termination voltage is greater than the thickness T2 in nm divided by 1.0 nm-$V^{-1}$. In this way, it can be ensured that the anodized segment AS can reach the side of the top metal layer TM facing the semiconductor layer A.

In some embodiments, a thickness of the top metal layer TM (e.g., the thickness T2 shown in FIG. 5G) is less than 1.0 μm. In this way, the voltage required for the anodization is not too high and can be easily controlled.

In some embodiments, as shown in FIG. 5H, the semiconductor layer A has a channel area Aa and a conduction area Ab. The channel area Aa is covered by and in contact with the anodized segment AS. The channel area Aa may be defined by a vertical projection of the anodized segment AS projected on the semiconductor layer A. The conduction area Ab is covered by and in contact with the other conductive segment of the top metal layer TM. In order to reduce the contact resistance of the conduction area Ab relative to the top metal layer TM, an annealing process may be performed to make the conduction area Ab react with aluminum in the top metal layer TM. Aluminum increases the oxygen vacancies of the conduction area Ab of the semiconductor layer A and thus its resistance is reduced. The annealing process also improves the stability of the channel area Aa of the semiconductor layer A.

In some embodiments, the top metal layer TM is anodized at a temperature under 15° C. In this way, the anodized segment AS of the top metal layer TM will be denser and thus the quality can be improved.

Figure 5I:
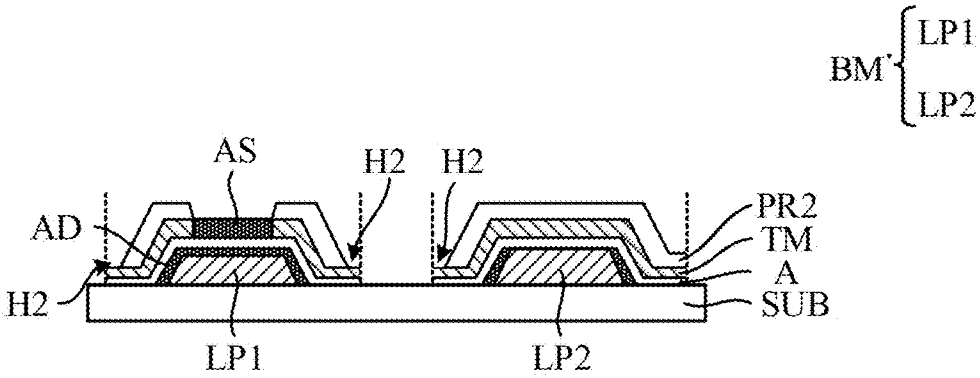

Reference is made to FIG. 5I. FIG. 5I is a schematic cross-sectional view of an intermediate stage of a method of manufacturing a structure having an electrode and an anodized part according to some embodiments of the present disclosure. The intermediate stage shown in FIG. 5H may be sequentially followed by the intermediate stage shown in FIG. 5I. As shown in FIG. 5I, second hollow portions H2 are formed in the second patterned photoresist PR2. In some embodiments, an ashing process is performed to the second patterned photoresist PR2 until the second hollow portions H2 are formed to expose portions of the top metal layer TM. In some embodiments, oxygen plasma is used in the ashing process to perform the erosion of the second patterned photoresist PR2.

Figure 5J:
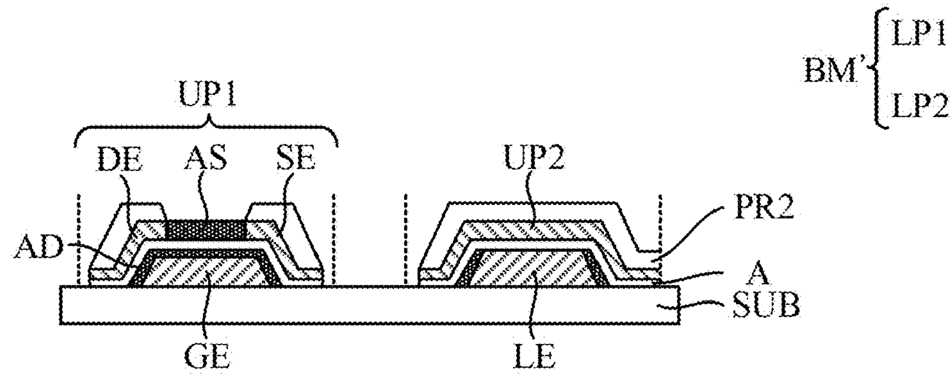

Reference is made to FIG. 5J. FIG. 5J is a schematic cross-sectional view of an intermediate stage of a method of manufacturing a structure having an electrode and an anodized part according to some embodiments of the present disclosure. The intermediate stage shown in FIG. 5I may be sequentially followed by the intermediate stage shown in FIG. 5J. As shown in FIG. 5J, the top metal layer TM is etched through the second hollow portions H2 to form a first upper metal pattern UP1 and a second upper metal pattern UP2. The first upper metal pattern UP1 is above the anodized first lower metal pattern LP1 and has a drain electrode DE and a source electrode SE. The drain electrode DE and the source electrode SE are connected to the anodized segment AS and electrically isolated from each other by the anodized segment AS. The anodized segment AS serves as a channel protect structure. The second upper metal pattern UP2 is above the second lower metal pattern LP2. The second upper metal pattern UP2 forms a contact structure with the second lower metal pattern LP2.

In some embodiments, an etch selectivity of the top metal layer TM and the anodized segment AS in the step of etching the top metal layer TM (as shown in FIG. 5J) is higher than 2.0.

Figure 5K:
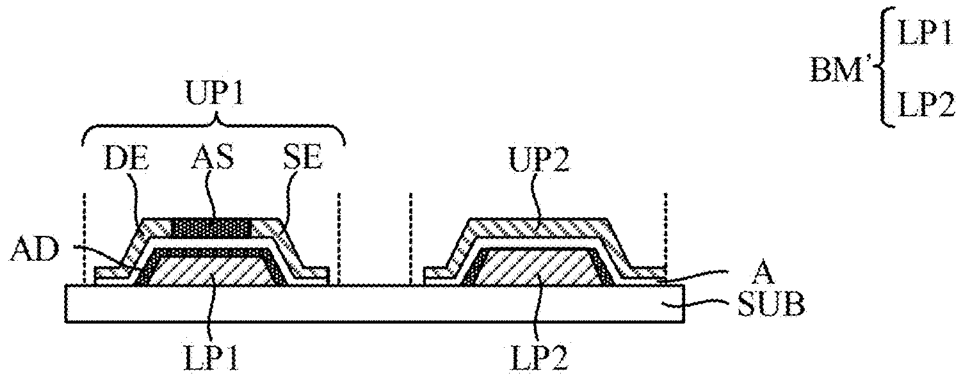

Reference is made to FIG. 5K. FIG. 5K is a schematic cross-sectional view of an intermediate stage of a method of manufacturing a structure having an electrode and an anodized part according to some embodiments of the present disclosure. The intermediate stage shown in FIG. 5J may be sequentially followed by the intermediate stage shown in FIG. 5K. As shown in FIG. 5K, the second patterned photoresist PR2 is removed to expose the first upper metal pattern UP1 and the second upper metal pattern UP2.

In some embodiments, a thickness of the semiconductor layer A is equal to or less than 100 nm. In this way, the back channel leakage may be reduced in certain circumstances. In addition, the problem of excessive contact resistance between the semiconductor layer A and other layers in contact with the semiconductor layer A (i.e., the second lower metal pattern LP2, the second upper metal pattern UP2, the drain electrode DE, and the source electrode SE) can be avoided.

Figure 6:
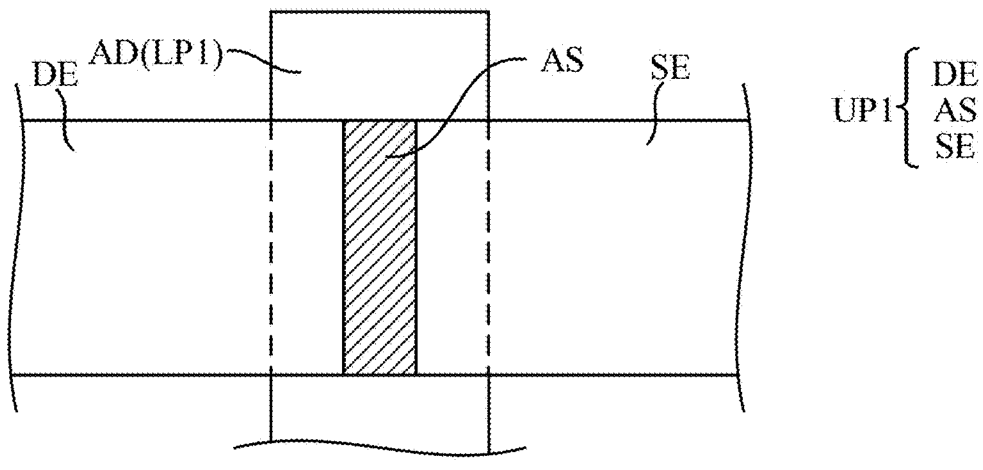
FIG. 6 is a partial top view of the structure shown in FIG. 5K according to some embodiments of the present disclosure.
Figure 7A:
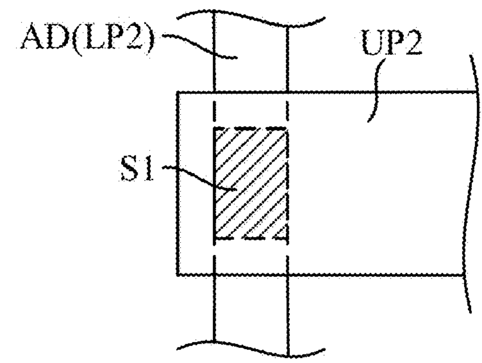
FIG. 7A is another partial top view of the structure shown in FIG. 5K according to some embodiments of the present disclosure.

Reference is made to FIGS. 6 and 7A. FIGS. 6 and 7A are partial top views of the structure shown in FIG. 5K according to some embodiments of the present disclosure. In detail, FIG. 6 is a partial schematic diagram showing the anodized first lower metal pattern LP1 (covered by the anodized part AD) and the first upper metal pattern UP1. FIG. 7A is a partial schematic diagram showing the anodized second lower metal pattern LP2 (covered by the anodized part AD and exposing the surface portion S1) and the second upper metal pattern UP2 that form the aforementioned contact structure.

Figure 7B:
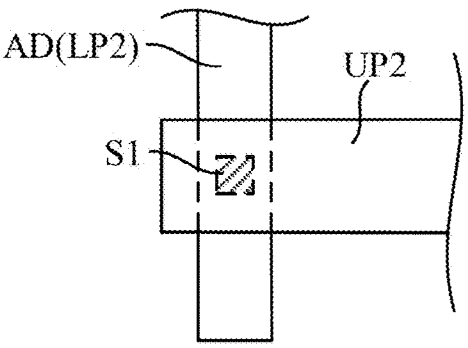
FIG. 7B is another partial top view of the structure shown in FIG. 5K according to some embodiments of the present disclosure.

Reference is made to FIG. 7B. FIG. 7B is another partial top view of the structure shown in FIG. 5K according to some embodiments of the present disclosure. As shown in FIG. 7B, the surface portion S1 of the second lower metal pattern LP2 exposed by the anodized part AD has a smaller area than that shown in FIG. 7A.

Figure 7C:
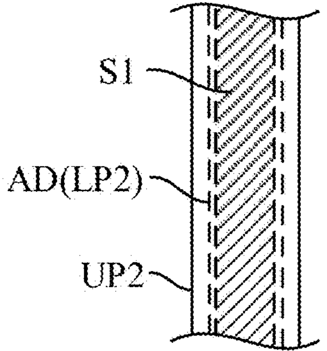
FIG. 7C is another partial top view of the structure shown in FIG. 5K according to some embodiments of the present disclosure.

Reference is made to FIG. 7C. FIG. 7C is another partial top view of the structure shown in FIG. 5K according to some embodiments of the present disclosure. As shown in FIG. 7C, both the surface portion S1 of the second lower metal pattern LP2 exposed by the anodized part AD and the second upper metal pattern UP2 covering the second lower metal pattern LP2 are extended along the second lower metal pattern LP2.

Accordingly, it can be seen that the method of manufacturing a structure having an electrode and an anodized part of the embodiments as shown in FIGS. 5A to 5K can be used to manufacture a thin-film transistor by only using two sets of PEP (Photo Engraving Process). Therefore, the cost of manufacturing a thin-film transistor can be significantly reduced and the manufacturing efficiency can be effectively enhanced.

Reference is made to FIGS. 8A to 8F. FIGS. 8A to 8F are schematic cross-sectional views of intermediate stages of a method of manufacturing a structure having an electrode and an anodized part according to some embodiments of the present disclosure. As shown in FIG. 8A, a gate electrode GE is formed on a substrate SUB by a set of PEP. As shown in FIG. 8B, a gate insulator layer GI is formed on the substrate SUB, for example, by depositing to cover the gate electrode GE. In some embodiments, the gate insulator layer GI is formed by using at least one of $SiO_2$, $Al_2O_3$ and $SiN_x$. As shown in FIG. 8C, a semiconductor layer A is formed, for example, by depositing to cover the gate insulator layer GI. As shown in FIG. 8D, a top metal layer TM is formed, for example, by depositing to cover the semiconductor layer A. As shown in FIG. 8E, the top metal layer TM is anodized to form an anodized segment AS, for example, by using the second patterned photoresist PR2 (omitted in FIG. 8E) as shown in FIG. 5G. As shown in FIG. 8F, the top metal layer TM is etched to form a drain electrode DE and a source electrode SE, for example, by using the second patterned photoresist PR2 as shown in FIG. 5I to which an ashing process is performed.

Figure 9A:
FIGS. 9A to 9F are schematic cross-sectional views of intermediate stages of a method of manufacturing a structure having an electrode and an anodized part according to some embodiments of the present disclosure.
Figure 9A:
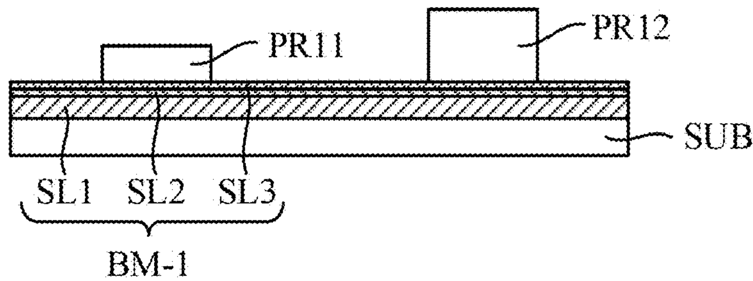

Reference is made to FIG. 9A. FIG. 9A is a schematic cross-sectional view of an intermediate stage of a method of manufacturing a structure having an electrode and an anodized part according to some embodiments of the present disclosure. In some embodiments, the intermediate stage shown in FIG. 5A may be directly followed by the intermediate stage shown in FIG. 9A. In other words, the bottom metal layer BM in FIG. 5A is replaced by a bottom metal layer BM-1 in FIG. 9A. As shown in FIG. 9A, the bottom metal layer BM-1 is a multi-layer structure. Specifically, the bottom metal layer BM-1 includes a first sub-layer SL1, a second sub-layer SL2, and a third sub-layer SL3. The first sub-layer SL1 contains aluminum. The second sub-layer SL2 is stacked on the first sub-layer SL1. The third sub-layer SL3 is stacked on the second sub-layer SL2.

In some embodiments, the second sub-layer SL2 contains molybdenum, but the disclosure is not limited in this regard. The second sub-layer SL2 which contains molybdenum can prevent the first sub-layer SL1 which contains aluminum from occurring hillock in the subsequent high temperature process. The anodization effect of molybdenum is not good, but it can be used as a barrier metal.

In some embodiments, the third sub-layer SL3 contains copper, but the disclosure is not limited in this regard. The third sub-layer SL3 which contains copper can increase the electrical conductivity of an entirety of the bottom metal layer BM-1. In some embodiments, the second sub-layer SL2 which contains molybdenum can serve as a barrier layer to prevent copper diffusion from the third sub-layer SL3 which contains copper.

In some other embodiments, the third sub-layer SL3 may contain a barrier metal such as tantalum, titanium, or tungsten, but the disclosure is not limited in this regard.

In some embodiments, one of the second sub-layer SL2 and the third sub-layer SL3 may be omitted. For example, in some embodiments, the bottom metal layer BM-1 may be a double-layer structure only including the first sub-layer SL1 and the second sub-layer SL2 which contains molybdenum. In some other embodiments, the bottom metal layer BM-1 may be a double-layer structure only including the first sub-layer SL1 and the third sub-layer SL3 which contains copper.

Figure 9B:
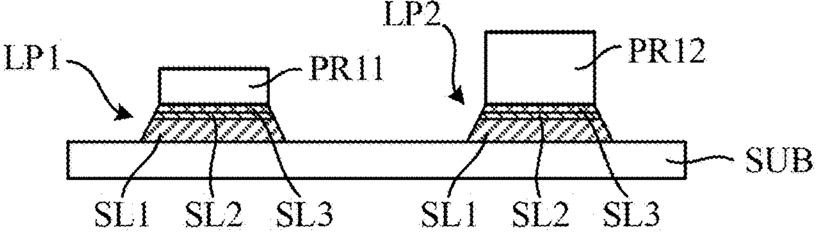

Reference is made to FIG. 9B. FIG. 9B is a schematic cross-sectional view of an intermediate stage of a method of manufacturing a structure having an electrode and an anodized part according to some embodiments of the present disclosure. The intermediate stage shown in FIG. 9A may be sequentially followed by the intermediate stage shown in FIG. 9B. As shown in FIG. 9B, the bottom metal layer BM-1 is etched through the first patterned photoresist PR1 to form a first lower metal pattern LP1 and a second lower metal pattern LP2. In addition, the first lower metal pattern LP1 and a second lower metal pattern LP2 are respectively covered by the first mask portion PR11 and the second mask portion PR12.

In some embodiments, the third sub-layer SL3 which contains copper may be selectively etched by using a $H_2O_2$ based etchant.

Figure 9C:
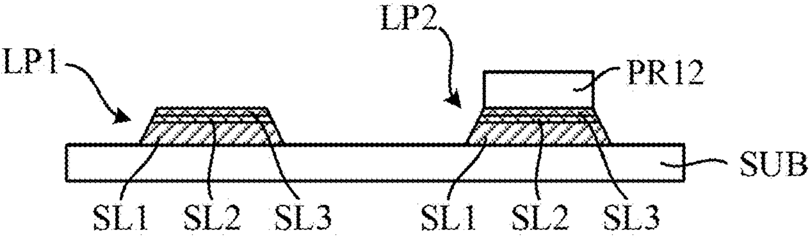

Reference is made to FIG. 9C. FIG. 9C is a schematic cross-sectional view of an intermediate stage of a method of manufacturing a structure having an electrode and an anodized part according to some embodiments of the present disclosure. The intermediate stage shown in FIG. 9B may be sequentially followed by the intermediate stage shown in FIG. 9C. As shown in FIG. 9C, the first mask portion PR11 is removed to expose a top surface of the third sub-layer SL3 of the first lower metal pattern LP1. The step of removing the first mask portion PR11 as shown in FIG. 9C is the same as or similar to that as shown in FIG. 5D, so it can be referred to the description about FIG. 5D and will not be repeated here.

Figure 9D:
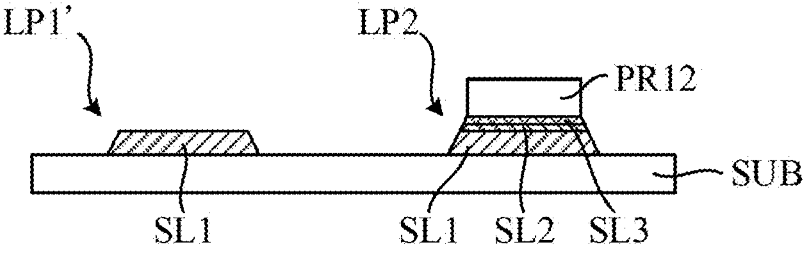

Reference is made to FIG. 9D. FIG. 9D is a schematic cross-sectional view of an intermediate stage of a method of manufacturing a structure having an electrode and an anodized part according to some embodiments of the present disclosure. The intermediate stage shown in FIG. 9C may be sequentially followed by the intermediate stage shown in FIG. 9D. As shown in FIG. 9D, the third sub-layer SL3 and the second sub-layer SL2 of the first lower metal pattern LP1 are selectively etched (relative to the first sub-layer SL1) to expose a top surface of the first sub-layer SL1. The remaining first sub-layer SL1 of the first lower metal pattern LP1 serves as a first lower metal pattern LP1'.

In some embodiments, the second sub-layer SL2 which contains molybdenum may be etched by using a solution containing hydrogen peroxide and citric acid.

In some embodiments, an etch selectivity of the second sub-layer SL2 and the first sub-layer SL1 in the selectively etching is higher than 2.0.

In some embodiments, the second sub-layer SL2 may be omitted. That is, the bottom metal layer BM-1 may only include the first sub-layer SL1 which contains aluminum and the third sub-layer SL3 which contains copper.

Figure 9E:
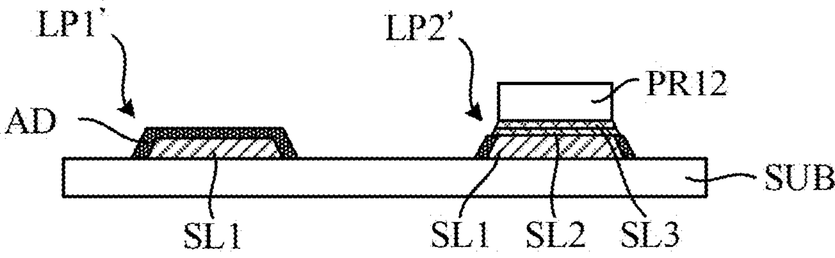

Reference is made to FIG. 9E. FIG. 9E is a schematic cross-sectional view of an intermediate stage of a method of manufacturing a structure having an electrode and an anodized part according to some embodiments of the present disclosure. The intermediate stage shown in FIG. 9D may be sequentially followed by the intermediate stage shown in FIG. 9E. As shown in FIG. 9E, the first lower metal pattern LP1' is anodized, and the second lower metal pattern LP2 is anodized to form a second lower metal pattern LP2'. The step of anodizing the first lower metal pattern LP1' and the second lower metal pattern LP2 as shown in FIG. 9E is the same as or similar to that as shown in FIG. 5E, so it can be referred to the description about FIG. 5E and will not be repeated here.

Figure 9F:
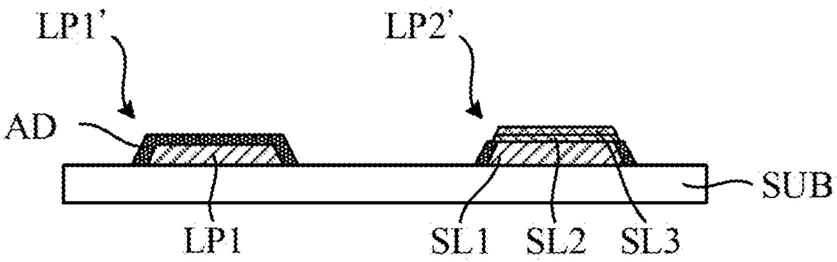

Reference is made to FIG. 9F. FIG. 9F is a schematic cross-sectional view of an intermediate stage of a method of manufacturing a structure having an electrode and an anodized part according to some embodiments of the present disclosure. The intermediate stage shown in FIG. 9E may be sequentially followed by the intermediate stage shown in FIG. 9F. As shown in FIG. 9F, the second mask portion PR12 is removed to expose a top surface of the third sub-layer SL3 of the second lower metal pattern LP2'. The step of removing the second mask portion PR12 as shown in FIG. 9F is the same as or similar to that as shown in FIG. 5F, so it can be referred to the description about FIG. 5F and will not be repeated here. In some embodiments, the intermediate stage shown in FIG. 9F may be sequentially followed by the intermediate stage shown in FIGS. 5G to 5K.

Figure 10A:
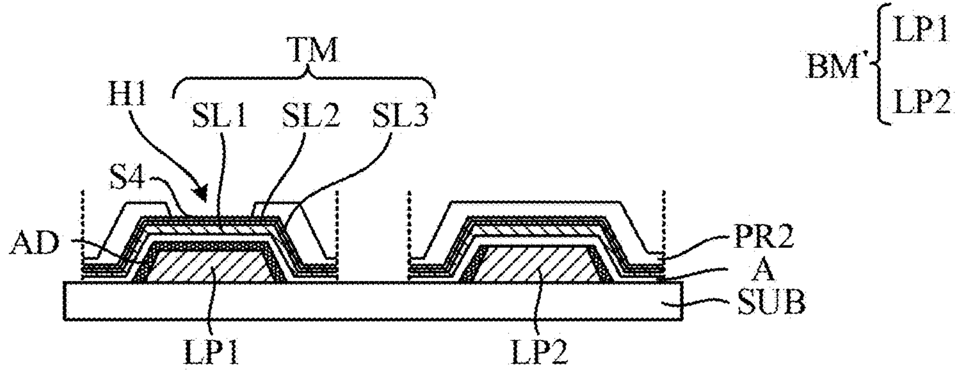
FIGS. 10A to 10C are schematic cross-sectional views of intermediate stages of a method of manufacturing a structure having an electrode and an anodized part according to some embodiments of the present disclosure.

Reference is made to FIG. 10A. FIG. 10A is a schematic cross-sectional view of an intermediate stage of a method of manufacturing a structure having an electrode and an anodized part according to some embodiments of the present disclosure. In some embodiments, the intermediate stage shown in FIG. 5F may be directly followed by the intermediate stage shown in FIG. 10A. As shown in FIG. 10A, a semiconductor layer A is deposited on the anodized bottom metal layer BM'. A top metal layer TM is deposited on the semiconductor layer A. A second patterned photoresist PR2 is formed on the top metal layer TM. In other words, the top metal layer TM in FIG. 5G is replaced by the top metal layer TM in FIG. 10A. As shown in FIG. 10A, the top metal layer TM is a multi-layer structure. Specifically, the top metal layer TM includes a first sub-layer SL1, a second sub-layer SL2, and a third sub-layer SL3. The first sub-layer SL1 contains aluminum. The second sub-layer SL2 is stacked on the first sub-layer SL1. The third sub-layer SL3 is stacked on the second sub-layer SL2. In addition, the second patterned photoresist PR2 has a first hollow portion H1 exposing a surface portion S4 of the top metal layer TM. The surface portion S4 is a portion of the top surface of the third sub-layer SL3 right above the first lower metal pattern LP1.

In some embodiments, the second sub-layer SL2 contains molybdenum, but the disclosure is not limited in this regard. The second sub-layer SL2 which contains molybdenum can prevent the first sub-layer SL1 which contains aluminum from occurring hillock in the subsequent high temperature process.

In some embodiments, the third sub-layer SL3 contains copper, but the disclosure is not limited in this regard.

In some embodiments, one of the second sub-layer SL2 and the third sub-layer SL3 may be omitted.

In some embodiments, the step of depositing the semiconductor layer A as shown in FIG. 10A is the same as or similar to that as shown in FIG. 5G, so it can be referred to the description about FIG. 5G and will not be repeated here. In some embodiments, the step of forming the second patterned photoresist PR2 as shown in FIG. 10A is the same as or similar to that as shown in FIG. 5G, so it can be referred to the description about FIG. 5G and will not be repeated here.

Figure 10B:
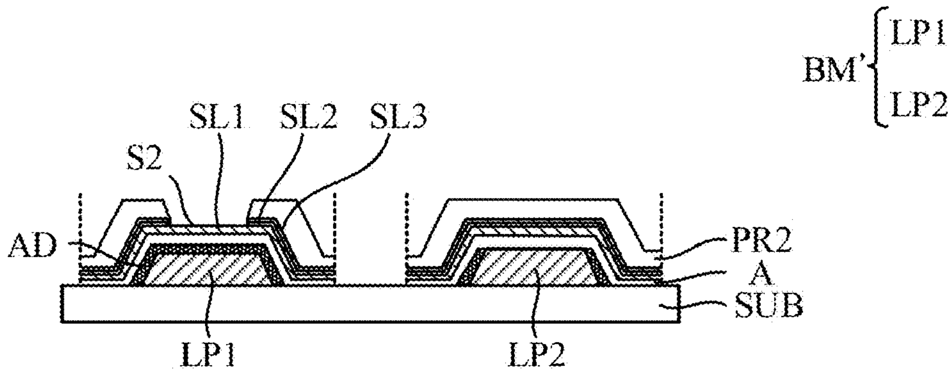

Reference is made to FIG. 10B. FIG. 10B is a schematic cross-sectional view of an intermediate stage of a method of manufacturing a structure having an electrode and an anodized part according to some embodiments of the present disclosure. The intermediate stage shown in FIG. 10A may be sequentially followed by the intermediate stage shown in FIG. 10B. As shown in FIG. 10B, the third sub-layer SL3 and the second sub-layer SL2 in the first hollow portion H1 are selectively etched relative to the first sub-layer SL1 to expose a surface portion S2 of the first sub-layer SL1 in the first hollow portion H1.

In some embodiments, the second sub-layer SL2 which contains molybdenum may be etched by using hydrogen peroxide and citric acid solution.

In some embodiments, an etch selectivity of the second sub-layer SL2 and the first sub-layer SL1 in the selectively etching is higher than 2.0.

In some embodiments, the second sub-layer SL2 may be omitted. That is, the top metal layer TM may only include the first sub-layer SL1 which contains aluminum and the third sub-layer SL3 which contains copper.

Figure 10C:
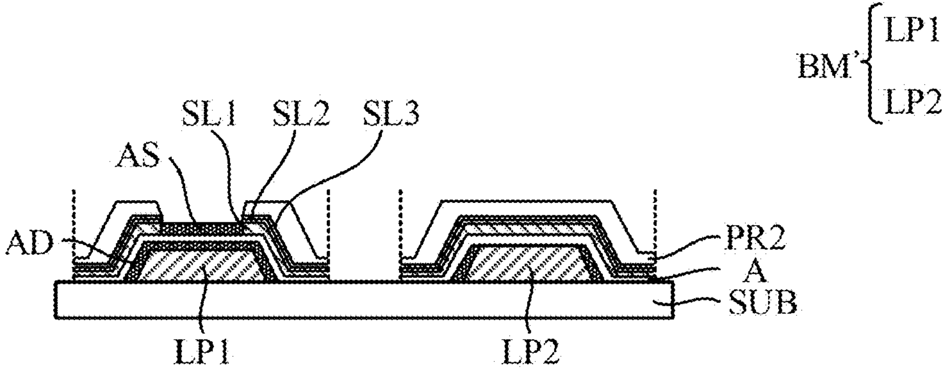

Reference is made to FIG. 10C. FIG. 10C is a schematic cross-sectional view of an intermediate stage of a method of manufacturing a structure having an electrode and an anodized part according to some embodiments of the present disclosure. The intermediate stage shown in FIG. 10B may be sequentially followed by the intermediate stage shown in FIG. 10C. As shown in FIG. 10C with reference to FIG. 10B, the surface portion S2 of the first sub-layer SL1 exposed by the first hollow portion H1 is anodized through the second patterned photoresist PR2 until the top metal layer TM has an anodized segment C extended from the surface portion of the first sub-layer SL1 exposed by the first hollow portion H1 to a side of the first sub-layer SL1 facing the semiconductor layer A. In some embodiments, the step of anodizing the first sub-layer SL1 of the top metal layer TM as shown in FIG. 10C is the same as or similar to that as shown in FIG. 5H, so it can be referred to the description about FIG. 5H and will not be repeated here.

According to the foregoing recitations of the embodiments of the disclosure, it can be seen that the method of the present disclosure can be used to manufacture a structure having an electrode and an anodized part. Furthermore, the method of the present disclosure can also be used to manufacture a thin-film transistor by only using two sets of PEP. Therefore, the manufacturing cost can be significantly reduced and the manufacturing efficiency can be effectively enhanced. In addition, in some embodiments of the method of the present disclosure where the top metal layer is anodized first and then etched, the lateral length of the anodized segment which serves as a channel protect structure can be controlled more precisely. Moreover, compared with the process of etching first and then anodizing, the process of anodizing first and then etching will not anodize edges of the top metal layer, so the degree of anodizing of the top metal layer can be better controlled (because the amount of charge for anodizing is easy to calculate).

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a structure having an electrode and an anodized part, comprising:
- forming a top metal layer on a substrate;
- forming a top patterned photoresist on the top metal layer to expose a portion of a top surface of the top metal layer, wherein the top patterned photoresist has a first mask portion and a second mask portion thicker than the first mask portion;
- anodizing the top metal layer through the top patterned photoresist to form an anodized segment;
- removing the first mask portion after the anodizing;
- etching the top metal layer through the top patterned photoresist after the removing the first mask portion to form a top metal pattern; and
- reflowing the top patterned photoresist after the anodizing and before the etching.

2. The method of claim 1, wherein a thickness of the top metal layer is less than 1.0 μm.

3. The method of claim 1, wherein the removing the first mask portion is performed by a plasma ashing process.

4. The method of claim 3, wherein the reflowing the top patterned photoresist is performed after the removing the first mask portion.

5. The method of claim 3, wherein reflowing the top patterned photoresist is performed before the removing the first mask portion.

6. The method of claim 1, further comprising:
- forming a semiconductor layer on the substrate before the forming the top metal layer, such that the semiconductor layer is covered by the top metal layer.

7. The method of claim 6, further comprising steps performed before the forming the semiconductor layer, wherein the steps comprises:

forming a bottom metal layer on the substrate;

forming a bottom patterned photoresist on the bottom metal layer, wherein the bottom patterned photoresist has a first mask portion and a second mask portion thicker than the first mask portion;

etching the bottom metal layer through the bottom patterned photoresist to form a bottom metal pattern;

removing the first mask portion of the bottom patterned photoresist;

anodizing the bottom metal pattern through the bottom patterned photoresist after the removing the first mask portion of the bottom patterned photoresist, such that the bottom metal pattern has an anodized part and an unanodized part covering the anodized part; and entirely removing the bottom patterned photoresist, wherein the forming the semiconductor layer covers the semiconductor layer on the anodized bottom metal pattern.

8. The method of claim 7, wherein the bottom metal layer contains aluminum.

9. The method of claim 7, wherein an atomic ratio of aluminum in the bottom metal layer is greater than 80%.

10. The method of claim 7, wherein the bottom metal layer comprises a first sub-layer containing aluminum and at least one second sub-layer stacked on the first sub-layer, and wherein the method further comprises:

selectively etching the at least one second sub-layer relative to the first sub-layer through the bottom patterned photoresist to expose the first sub-layer after the removing the first mask portion of the bottom patterned photoresist and before the anodizing the bottom metal pattern.

11. The method of claim 7, wherein the removing the first mask portion of the bottom patterned photoresist is performed by a plasma ashing process.

12. The method of claim 11, wherein gas used in the plasma ashing process contains $CO_2$.

13. The method of claim 12, wherein the gas further contains Ar.

14. The method of claim 6, further comprising steps performed before the forming the semiconductor layer, wherein the steps comprises:

forming a gate electrode on the substrate from a bottom metal layer; and forming a gate insulator layer on the substrate to cover the gate electrode, wherein the forming the semiconductor layer covers the semiconductor layer on the gate insulator layer.

15. The method of claim 14, wherein the forming the gate insulator layer is performed by using at least one of $SiO_2$, $Al_2O_3$ and $SiN_x$.

16. The method of claim 6, wherein a thickness of the semiconductor layer is less than 100 nm.

17. The method of claim 1, wherein an etch selectivity of the top metal layer and the anodized segment is greater than 2.0.

18. The method of claim 1, wherein the top metal layer comprises a first sub-layer containing aluminum and at least one second sub-layer stacked on the first sub-layer, and wherein the method further comprises:

selectively etching the at least one second sub-layer relative to the first sub-layer through the top patterned photoresist to expose the first sub-layer before the anodizing the top metal layer.

19. The method of claim 18, wherein the at least one second sub-layer contains copper.

20. The method of claim 1, wherein the anodizing is performed until the anodized segment reaches a side of the top metal layer away from the top patterned photoresist.

21. The method of claim 1, wherein an atomic ratio of aluminum in the top metal layer is greater than 80%.

22. The method of claim 1, wherein a width of the anodized segment is smaller than 20 μm.

* * * * *